United States Patent [19]

Langdon, Jr. et al.

[11] Patent Number: 4,494,108
[45] Date of Patent: Jan. 15, 1985

[54] ADAPTIVE SOURCE MODELING FOR DATA FILE COMPRESSION WITHIN BOUNDED MEMORY

[75] Inventors: Glen G. Langdon, Jr., San Jose; Jorma J. Rissanen, Los Gatos, both of Calif.

[73] Assignee: International Business Machines Corporation, Armonk, N.Y.

[21] Appl. No.: 617,303

[22] Filed: Jun. 5, 1984

Related U.S. Application Data

[63] Continuation of Ser. No. 319,542, Nov. 9, 1981, abandoned.

[51] Int. Cl.³ .............................................. H03K 13/00
[52] U.S. Cl. .................................................. 340/347 DD
[58] Field of Search ................. 340/347 DD; 235/310, 235/311; 364/200, 900

[56] References Cited

U.S. PATENT DOCUMENTS 4,099,257 7/1978 Arnold ...................... 340/347 DD

OTHER PUBLICATIONS

Langdon "IEEE Transactions on Communications" vol. 29, No. 6, pp. 858–867, Jun. 1981.
Rissanen "IBM Journal of Research and Development" vol. 23, No. 2, Jun., 1979, pp. 149–162.
Mommens "IBM Report RC5150" 11/26/74.

Primary Examiner—Charles D. Miller
Attorney, Agent, or Firm—R. Bruce Brodie

[57] ABSTRACT

A two-stage single pass adaptive modeling method and means for a finite alphabet first order MARKOV symbol source where the model is used to control an encoder on a per symbol basis thereby enabling efficient compression within a fixed preselected implementation complexity.

2 Claims, 3 Drawing Figures

COMPRESSION SYSTEM

DECOMPRESSION SUBSYSTEM

MODE STRUCTURE

ADAPTIVE SOURCE MODELING FOR DATA FILE COMPRESSION WITHIN BOUNDED MEMORY

This is a continuation of application Ser. No. 319,542 filed Nov. 9, 1981, now abandoned.

TECHNICAL FIELD

This invention relates to adaptively modeling symbol source statistics in aid of efficient compression coding.

BACKGROUND ART

This invention concerns accurate modeling of a symbol source in a single pass in order to permit "on the fly" compression coding. The term "modeling" signifies the data processing measures necessary to obtain a profile of the source and to assist compression.

Langdon and Rissanen, "Compression of Black-White Images With Arithmetic Coding", IEEE Transactions on Communications, Vol. 29, No. 6, June 1981, describe a compression system having separate model and code units. The model approximates the statistical characteristics of the symbol source. Each symbol is simultaneously applied to the model and encoding units. Responsively, the model conditions the encoder with respect to encoding one or more subsequent symbols. Advantageously, a model of a source emulates a reduced number of symbols and strings and brings about an economy of internal states and memory size. This is brought about by "modeling" only the most popular symbols. Further, rarely occurring symbols can of course be transmitted in the clear without substantially affecting compression.

A model comprises a finite state machine (FSM) and statistics of the symbol source. An encoder is also a finite state machine as for example described in Rissanen and Langdon, "Arithmetic Coding", IBM Journal of Research and Development, Vol. 23, No. 2, March 1979, at pp. 149-162. Together, the model and encoding units execute a coding function. In this regard, a coding function maps each string in a source alphabet to a counterpart string in a code alphabet. To reduce computational complexity, the mapping of an arbitrarily long source string is not made to its image in the set of code strings in a single step. Rather, most coding functions are recursive in that the next function value depends upon the instantaneous function value, source symbol, and other attributes. Typically, a function consists of a series of operations, applied to each successive symbol of the source string from left to right. In order to be physically realizable, recursive functions have a finite amount of memory.

Encoding and decoding functions are both performed by FSM's. For each encoding or decoding operation, the FSM accepts an input, delivers an output, and changes its internal state. The coder accepts a string of source symbols, one at a time, and performs an invertible transformation into a code string. Since the model and the coder are distinct FSM's the model state is distinguished from that of the encoder state.

In the design of a lossless data compression system, the source is initially "modeled" and then a code is devised for the modeled source. Illustratively, consider the natural alphabet in which strings are written consisting of eight-bit binary symbols or "bytes". Rarely do all 256 possible symbols for an eight-bit byte appear in any given sequence. Depending upon the symbol source, only a minority in the order of 40 to 80 characters commonly occur. This permits an economy of internal states and memory size to be made.

If the probability of generating any source symbol were completely independent of any previous source symbol, then the source is said to be a zero order MARKOV (memoryless) source. However, a memoryless source is rare, and more frequently the source symbols may exercise an intersymbol influence. This is reflected in sets of conditional events and probabilities. A more general information source with n distinguishable symbols is one in which the occurrence of the source symbol is affected by a finite number of m preceding symbols. Such a source is termed an mth order MARKOV source. For an mth order MARKOV source, the conditional probability of emitting a given symbol is determined by the m preceding symbols. At any one time, therefore, the m preceding symbols define the state of the mth order MARKOV source at that time. Since there are q possible symbols, then an mth order MARKOV source will have $q^m$ possible states. As symbols are emitted from the source, the state changes. Thus, for a 256 symbol alphabet, a second order MARKOV source or model thereof would require $256^2 = 64,000$ states. For this reason, higher order MARKOV modeling is frequently impracticable.

The aforementioned Langdon, et al., reference describing black-white image compression discloses a two stage modeling in which the first stage is a neighborhood template for identifying the context which in turn identifies conditional probability distribution of the next pel to be encoded given the instantaneous pel. The notion "context" or conditioning class is a generalization of "state". The actual statistics or counts determining the distribution in either case are derived on the fly from the input pel stream. That is, there exists a fixed model of the symbol source conditioning class or context and an adaptive modeling of the conditional probability distribution within each context within one pass of the data.

In the past, attempts to manage first order MARKOV model requirements are handled in diverse ways. For instance, Mommens and Raviv, "Coding For Data Compaction", IBM Report RC5150, Nov. 26, 1974, describes the use of a first order MARKOV model for decomposing a higher order character stream into a multiple of lower order character streams. This involved multiple passes. The first pass ascertained the conditional probability of a first full first order MARKOV model of the symbol stream. The number of states was reduced by forming equivalence classes having approximately equal conditional probability distribution. A compression code was then formed for each equivalence class. A second pass assigning the code to the symbols was required. Lastly, Arnold, et al., U.S. Pat. No. 4,099,257, used a fixed partial first order MARKOV FSM to context encode characters common to two alphabets. For instance, if a t was always lower case, it would be encoded as an upper case t if the symbol preceding it was a ".".

THE INVENTION

Although it was known that increasing the number of contexts or conditioning classes would enhance the fidelity of the model to the source symbol statistics, it was unexpectedly observed that a two level adaptive model could substantially approximate a full first order MARKOV model of a symbol source. At the first level, the conditioning contexts themselves are generated in an adaptive manner. At the second level, for each selected conditioning context, the symbol statistics are determined adaptively as the string is being encoded. The only predetermined aspect is the maximum number of conditioning states. Thus, to each state there corresponds a probability distribution for the next symbol which depends only on that state. State selection is accomplished in one pass by the steps of initially assigning all symbols to a single "lump" state for conditioning purposes and then adding frequently occurring symbols or strings thereof as additional conditioning states as a result of satisfying a selection criterion. As soon as a state has been created, the second adaptive process of determining the conditional state dependent probability distribution can begin. Indicators of the state dependent probabilities are passed to the coding unit as needed.

More particularly, the method of coding symbols generated by an N-distinguishable symbol alphabet source in a single pass comprises the steps of modeling the source; and selecting and combining a code word from one of N tables of code words with a code word string. The selecting and combining step are jointly responsive to the model and each symbol occurrence from the source. In this invention, the modeling step includes (a) ascertaining the first $(k-1) < N$ symbols appearing $(M > 1)$ times as generated by the source; (b) forming and associating a conditional symbol probability distribution with respect to each ascertained symbol; and (c) passing parameters indicative of the distribution to the extrinsic coding steps of selecting and combining responsive to each source symbol occurrence.

Clearly, the double adaptation permits single pass compression and a partial first order modeling using less memory than that required for a full first order model. If a first order model of N symbols required a table size to hold the nxn probabilities, this invention needs only kxn.

For an eight-bit byte or 256 symbol source having only 49 distinguished symbols, n=256 and k=50, and kxn=12,800 while nxn=65,536.

The technical advance is to fix the number k and then find the $k-1$ "most useful" characters to act as states (contexts). The k-th context is where all remaining characters are "lumped", and some additional states may be reserved for special run states.

In order for a state to be considered "useful", the state must occur frequently, and it must have a "skewed" conditional probability distribution for the next symbol. This latter requirement provides a low conditional entropy for said next symbol. Although these two requirements may be conflicting, it has been found experimentally that whenever compression is possible with first order MARKOV models, the most frequently occurring symbols also tend to have low conditional entropy.

The terms "symbol" and "state" are used in several senses. Firstly, a 'symbol' selects the 'state' of the model. At the least, a 'symbol' is a member of the lump state. Secondly, a symbol is an encoded object in its own right; we sometimes refer to this role of the symbol as the "next" symbol, or we say that the symbol "occurs" in the state determined by the selected symbols.

DESCRIPTION OF THE PREFERRED EMBODIMENT AND INDUSTRIAL APPLICABILITY

THEORETICAL CONCERNS

Figure 1:
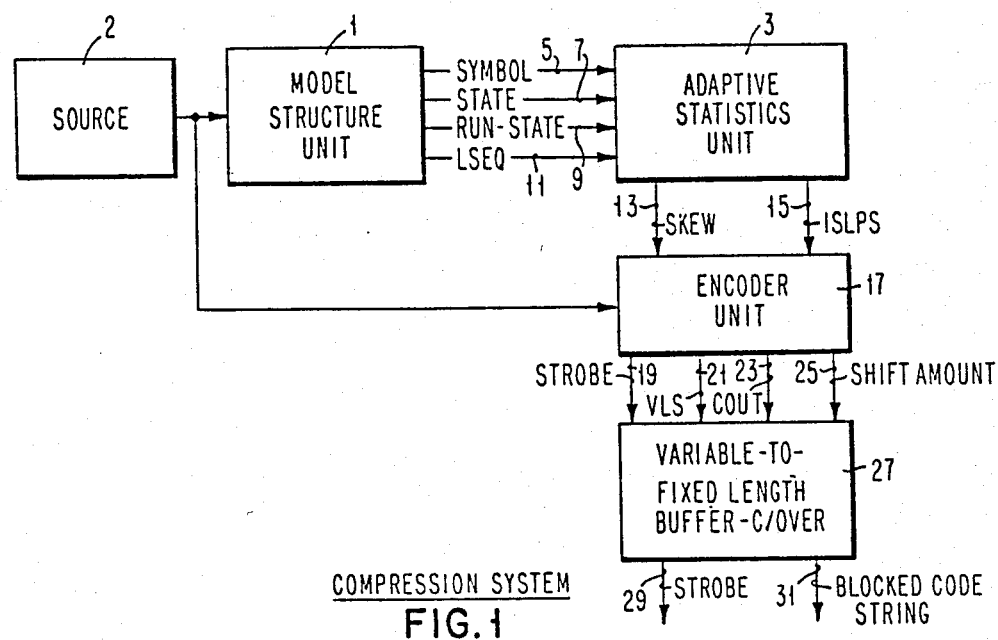
FIG. 1 shows a block diagram of a compression system including a two-stage modeling unit.

A model consists of a structure and a set of probability parameters. The structure is defined by a finite set of contexts. The set of all finite strings $s = x(1), x(2) \ldots$ of the symbols in an alphabet S is partitioned into contexts or conditioning classes. The notion "context" is a generalization of "state". There exists a general recursive function f, which maps each string s to its context $z = f(s)$. Associated with each context z, let $[(i/z)]$ denote a set of probability parameters, i.e., non-negative numbers which add up to 1. Collectively, the parameters for a context are called the statistics. The model statistics function assigns $P(i/f(s))$ as the conditional probability of the symbol following string s to be symbol i, given the context f(s). The set of the contexts, or, more precisely the function f, together with the sets $[P(i/z)]$ defines a stationary model when $P(i/f(s))$ depends only on the context f(s) and symbol i.

With respect to adaptive statistics for a structure function f, let s[z] be the succession of symbols of string s which occur at context z. An adaptive function alpha recursively generates the conditional probability $P(i/z,s[z])$ as a function of the string of the symbols at the past symbol occurrences of the context z in s:

Adaptive statistics: alpha: $(i,s,f(s)) \; P(i/z,s[z])$.

This formulation is a two step process. The first step is the evaluation of the model structure function f which determines the context z for each symbol. The second step is the evaluation of the model statistics function which determines $P(i/z,s[z])$ for symbol i and the past history in its context. Adaptations for the statistics function involves in formation from the prior string s. In most configurations, alpha involves a counting mechanism in order to determine the relative popularity of the symbols. In bit oriented strings, the adaptive statistics may be reduced to a binary choice.

In the above formulation of adaptation, each context is treated as an independent symbol source. Past symbols which occur in contexts other than z do not affect the assignment of the probabilities conditioned on z.

In both the stationary and adaptive statistics models, the total number, $k(n-1)$, of probabilities gives the complexity of the model. In this regard, k denotes the number of contexts and n the number of distinguishable symbols. Complexity clearly measures the size of the working tables that both an encoder and a decoder must access as a code string is being processed. This information may be viewed as being organized into k subtables of $(n-1)$ words where each word includes a coding parameter parenthetically, the complexity of the stationary and adaptive models so far considered is a function of the cardinality of the alphabet and the set of contexts. It is independent of the source symbol string. Structure f may be embodied by way of a finite state machine. In that case, it is desirable to distinguish between a state and context. However, the complexity of the model depends on the number of conditioning contexts, which may be less than the number of internal states of the FSM.

ADAPTATION OF CONTEXTS

Previously, adaptation was always restricted to an estimate of the conditional probabilities $P(i/z,s[x])$. It is considered to be a generalization of the statistics function.

A first order to MARKOV model of a byte wide source symbol alphabet has 256 possible conditioning states. A limit $k<256$ of the distinct contexts that are allowed to occur on any string is equivalent to stating that k is the cardinality of the range of the model structure function f. It is possible to determine for each string, the maximum of k "best" contexts as the string is being encoded. This means that the effective complexity of the model is $k(n-1)$ as compared with $n(n-1)$, which is the complexity of a full first order MARKOV model.

Each value for a byte may be viewed as a leaf of a completely balanced binary tree of depth 8. The 256 leaves define the byte. For each byte value, there is a unique path from the root to the leaf. The i-th "branch" is selected by the value of the i-th bit. Starting at the root and following the path defined by the byte, it is possible to maintain and update a corresponding branch count at each internal node passed. To form an FSM, each internal node corresponds to a state. As described in D. Knuth, "The Art of Computer Programming", Vol 1, Fundamental Algorithms, Second Edition, Addison-Wesley, 1975, the path to a node defines the address of the node while its son's addresses are given by doubling the parent address for one son, and incrementing the double parent address by one for the other son. It is observed that each bit's statistics are conditioned on a joint context formed by two components. The first component is determined by structure function f which designates the context or conditioning class. To each context z, there corresponds a subtable of words. The second component for the bit's context is the internal node of the depth 8 binary tree. The node corresponds uniquely to the bit position within the byte and the previous bit values of the byte. Thus, the total context on which the binary events are conditioned consists of the adaptively determined symbol context z together with the prefix of the byte being processed. In order to update and maintain the statistics of each contextual binary symbol, the adaptive strategy produces two counts $c(0/s)$ and $c(1/s)$ for each binary symbol in the string. There is a computational advantage to control the value of the lower count, denoted $c(L/s)$. Let L denote the less probable symbol while $L'$ is the more probable symbol. If the opposite symbol $L'$ is observed, the larger count $c(L'/s)$ is updated by one to form the count $c(L'/s.1')$, where $s.L'$ means symbol $L'$ which is concatenated to string s. The lower count stays at one. Also, if the next symbol is L, there is no updating of $c(L/sL)$ into a value such as 2. Instead, this same ratio is obtained by halving $c(L'/sL)$. Should $c(L'/sL)$ become less than one by this halving, it is rounded to one and the roles of the low probability and high probability symbol L and $L'$ are switched. Finally, the adaptive statistics function alpha summarizes the higher count $c(L'/s)$ as a skew number $K(s)$. The skew number is an integer control parameter outputted from the second stage of the model unit an applied to the coder. This has been described in Helman, et al., "Arithmetic Compression Code Control Parameter Approximation", IBM Technical Disclosure Bulletin, Vol. 23, No. 11, April 1981, at pp. 5112-5114. At this point, the count is converted to skew as follows: Count 1 gives the skew number 1, Counts 2 and 3 give skew number 2, Counts 4, 5, 6 and 7 give skew number 3, etc. That is, the skew number increases as the log of the Count $c(L'/s)$. The adaptive strategy approximates the estimated ratio $c(L/s)/(c)L/s)+c(L'/s))$ by the special probability $2^{-K(s)}$, and delivers the statistics of the symbol to be encoded in the form of a skew: $(L(s),K(s))$.

RUN MODE

In order to encode runs using a single skew to describe the event of whether the symbol repeats or not, it is necessary to define a context within which to encode runs. Thus, a run mode may be defined whenever a symbol occurs r times in a row. Typically, r is taken to equal to 3. When not in run mode, the symbol may be considered in the symbol mode. When the last three symbols encoded have the same value, then the run mode is entered and the next event encoded means either "continue" or "stop" the run. if the event "continue" is encoded, the last r symbols have the same value while the next event occurs under run mode. The Count $c(L'/s)$ is updated each time. The encoding process for run mode continues for each repetition of the symbol until the event "stop" is encoded. After the "stop" event, the run Count $C(L'/s)$ is halved. The symbol mode is then entered. The symbol which stopped the run is encoded under the context of the previous run symbol.

So far, there has been described a condition under which it is possible to enter the run mode. Also described was a method for encoding each repetition of the symbol using adaptive statistics gathering as for any other binary event encoding. However, it is necessary to locate the count value $c(L'/s)$ when in the run mode. In one implementation, if a coding parameter table requires an 8-bit address, this consumes 256 words. However, word zero of the table may be unused. Therefore, a "spare word" in the subtable for each symbol context can then be assigned to the run mode. Consequently, in symbol mode one of the 255 words corresponding to an interior node is addressed beginning with the word "one". The previously mentioned doubling technique is used to walk down the nodes of the tree. In run mode, word "zero" of the table is addressed, since only words 1 through 255 are used for the 8-bit bytes.

THE PREFERRED EMBODIMENTS

Referring now to FIG. 1, there is shown a block diagram of a compression subsystem. Source 2 generates a symbol which is concurrently applied to the model structure unit 1, the encoding unit 17. Unit 1 responsive to the symbol determines its conditioning state. This information is passed to the adaptive statistics unit 3 along with the symbol. The ASU maintains the statistics (conditional probability distribution) for each state in an adaptive fashion on a bit basis. The symbol is encoded a bit at a time via the linearized tree structure described in Langdon, et al., "Deblocking Method For Use With An Adaptive Arithmetic Encoder/Decoder", IBM Technical Disclosure Bulletin, Vol 23, No. 6, November 1980, at pp. 2528-2529.

The linearized tree entry described in this reference provides the adaptive skew information discussed in Helman, et al. The tree entry is a count field $c(L'/s)$ for the more probable symbol $L'$, and a bid for the $L'$ value. The position of the leading one bit of the count field indicates the skew value. The bit value in the symbol to be encoded is compared with the L value in order to generate signal ISLPS on path 15 coupling the ASU 3 to encoder unit 17. Encoder unit 17 encodes the bit to the working end of the code stream, in accordance with the method set out in Langdon, et al., U.S. Pat. No. 4,286,256, "Method and Means for Arithmetic Coding Utilizing a Reduced Number of Operations", issued Aug. 25, 1981. Thusly, the encoder unit passes a variable length string with its concomitant parameters such as carry, shift amount and strobe values over dedicated paths 23, 25, and 19, to a variable to fixed length buffer 27. Buffer 27 preferably includes a logic for blocking the encoded string. Carryover control in buffering is described in copending Langdon, et al. U.S. patent application Ser. No. 048,318 filed June 14, 1979, and entitled "A Method and Means for Carryover Control in High Order to Low Order Pairwise Combining of Digits of a Decodable Set of Relatively Shifted Finite Number Strings".

Figure 3:
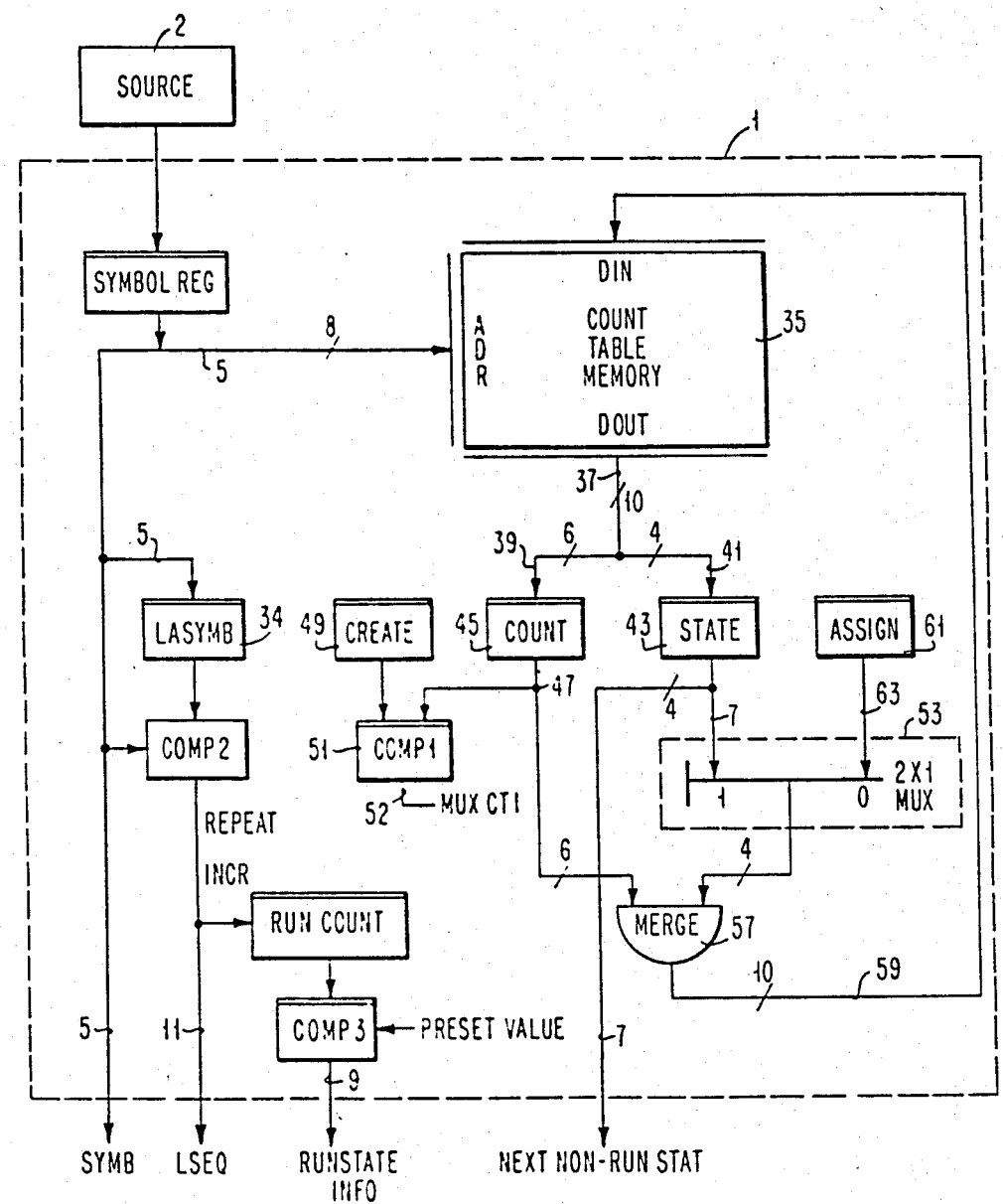
FIG. 3 sets out the detailed logic of the adaptive context for model structure unit of FIG. 1.

Referring now to FIG. 3, there is shown the implementation of the first adaptive stage or model structure unit one of FIG. 1. A 256 word table 35 includes one word for each distinct symbol value. The Count Table is involved in the determination of the conditioning context under which the symbol is to be compressed. As may be recalled, corresponding to each conditioning context, there is associated a conditional probability distribution located in ASU 3. However, the model structure unit must pass to the ASU a parameter identifying the conditioning state. The symbol value which addresses the Count Table determines the state for encoding the symbol following the instantaneous symbol.

Each Count Table word includes two fields, namely, a count field and a state field. The count field represents the count occurrences of the symbols corresponding to the address. The state field contains the state designator for the symbol. When a word is read, these fields are respectively stored in register 45 (count) and register 43 (state). The count register is a parallel loading register than can be counted up or incremented. The count field is used to count the symbol instances in order to determine the more popular symbols. The lump state has state designator "zero". All symbols are initially compressed in that state.

States are created by assigning a designator to the popular symbols. Each symbol to be compressed causes an access to the Count Table. The value in the count is incremented and then compared to a system controlled parameter N in register (create) 49. When a symbol count reaches the value in the create register such as 50 as determined by comparator 51, it is then assigned the next available unassigned state designator from register (assign) 61. The assign register is initialized to "one". This is the next state designator to be assigned to a selected conditioning symbol. The state designator for the symbol is the value read from the Count Table Memory. Following the incrementing of the count and selection of the new designator from the assigned register, the new count and state designator are rewritten to the Count Table Memory.

Following the creation of a new conditioning state, the assigned register is incremented. When the assigned register is incremented beyond the maximum number of allowable conditioning states, the count and assign mechanisms are disabled. From this point to the end of the symbol sequence, the state designators in the Count Table remain the same. Alternatively, the count and assign mechanisms could be reinitialized, say, every 4000 bytes.

The run mode should now be considered. When a new symbol is stored in register (symbol) 33, the previous symbol value is stored in register (LASYMB) 34. The present and the previous symbols are compared in comparator 2 and if equal the run count register is incremented. This value is compared with a predetermined value r, for example 3, and if greater than or equal, the structure is placed in run mode. When run mode is entered, the run event encoded begins with the symbol following the symbol in the symbol register which caused the run mode.

At the beginning of a symbol cycle, a new value of symbol arrives. This is passed on to the ASU. This symbol is to be encoded under the state designator or context determined by the previous symbol. For this determination, the previous value in the symbol register was used to access the Count Table Memory in order to determine the state for the current symbol. If the conditions are met for the run mode, this takes precedence over the symbol mode. However, the ASU still uses location zero of the adaptive Count Table for the skew of the run.

For each symbol cycle of the model unit 1, the ASU typically undergoes eight cycles. That is, one cycle for each bit of the 8-bit symbol. In run mode, the ASU undergoes one cycle, if the LSEQ (last symbol equal) 11 is active and nine cycles if it is inactive. In the nine cycle case, the first cycle indicates the end of the run and the next eight cycles encode the value of the symbol which broke the run.

The model unit 1 passes the symbol to the ASU over path 5 from register 33. Run state information is passed from comparators 2 and 3 over paths 11 and 9 while the next non-run state is passed from register 43 over path 7. Note that the updating of the count and state and assignment registers with respect to the contents of the Memory 35 is by way of logic element 57. The contents of the 4-bit state and assignment registers are multiplexed over unit 53 and concatenated with the 6-bit contents of the count register 45 to form the 10-bit word on path 59.

Figure 2:
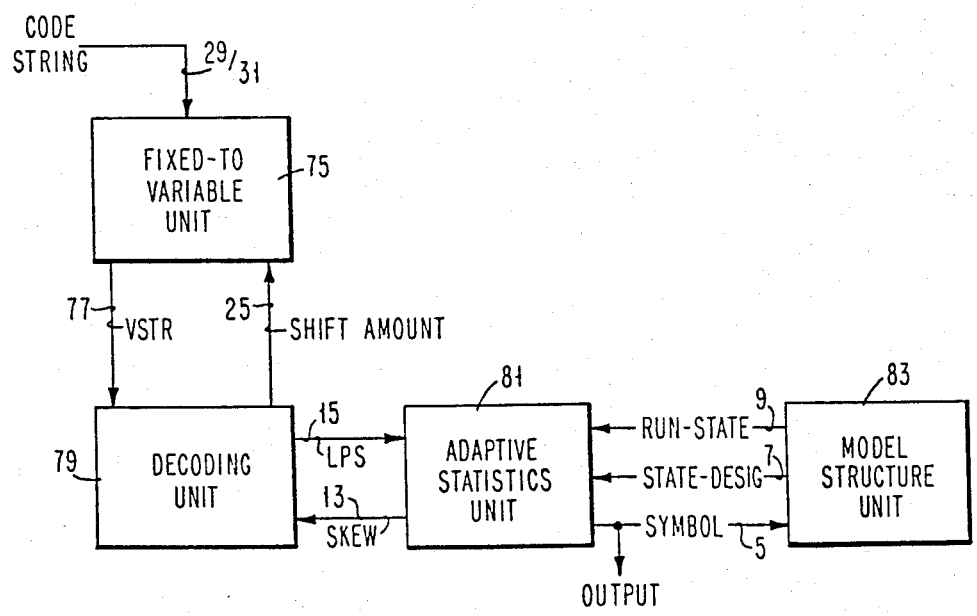
FIG. 2 shows the two-stage model unit configured in a decompression subsystem.

Referring now to FIG. 2, there is shown a decompression subsystem. A fixed variable buffer 75 accumulates the code string over paths 29 and 31. The buffer 75 provides the decoding unit 79 with the working end of the compressed code string. The decoder receives the skew for each bit from the local ASU 81. The ASU 81 uses the state designator supplied by the local model structure unit 83 which determines the conditioning states of the next symbol to be decoded. On each subcycle, the decoding unit decodes another bit. The symbol mode, every eighth bit decoded changes the conditioning state being used by the ASU.

The invention embodied in the model structure unit supplies the symbol mode or run mode indication and indicates which 256 word subtable is to be used by the ASU. In symbol mode, the ASU progresses through the indicated subtable and retrieves and updates each subtable word as previously described. The subtable word is used to determine the skew (L(s),K(s)), which is passed to the compression encoder. In run mode, the ASU retrieves and updates word zero of the indicated subtable.

The method and apparatus of this invention can be used with any compression encoder capable of encoding events under control of a parameter or suitable adaptive or nonadaptive approximation to the symbol of probabilities, including such adaptive Huffman code units as described by Gallager, "Variations on a Theme by Huffman", IEEE Transactions on Information Theory, November 1978, pp. 671–673. Decoding is executed event by event with the coding parameters for the next event supplied by the same ASU as for the encoder. In Gallager, the coding parameter is a set of codewords, determined for decompression as for the compression phase by the same two step process. That is, the structure function f assigns each byte to a context f(s) and to a symbol or run mode. Next, the statistic's function alpha accesses and updates the proper subtable to determine the coding parameter.

As hereinbefore described, this invention does not depend on predetermined statistics. By using the most popular symbols as first order conditioning states, significant compression can be obtained within a memory constraint. It should further be appreciated that the method and apparatus of this invention requires only one pass on the data. This is accomplished despite the double adaptation in which (1) a model structure unit adapts by selecting and using popular symbols as conditioning contexts, and (2) the adaptive statistics unit adapts to the skew number for each bit.

While the invention has been particularly shown and described with reference to a preferred embodiment, it will be understood by those skilled in this art that changes in form and details may be made therein without departing from the spirit and scope of the invention.

We claim:

1. A machine implementable method for dynamically selecting conditioning states thereby enabling an efficient compression with fixed preselected implementation complexity in the adaptive compression of a symbol string generated from an N distinguishable symbol alphabet MARKOV type symbol source with adaptation in the run on piecewise stationary source statistics, the method steps comprising within a single pass process:

ascertaining the first $(k-1) < N$ symbols appearing M times, initially treating all symbols as a single conditioning state, and thereafter distinguishing and removing at most k symbols as their occurrence count exceeds M where M varies according to the remaining number of states yet to be ascertained;

pairing each of the conditioning states with each symbol and determining the associated conditional symbol probability distribution; and passing parameters indicative of the distribution to an extrinsic compression coding process.

2. In the method of coding symbols generated by an N-distinguishable symbol alphabet source in a single pass comprising the steps of modeling the source; and selecting and combining a code word from one of N tables of code words with a code word string, said selecting and combining step being jointly responsive to the model and each symbol occurrence from the source, wherein the modeling step includes:

(a) ascertaining the first $(k-1) < N$ symbols appearing $(M > 1)$ times as generated by the source;

(b) forming and associating a conditional symbol probability distribution with respect to each ascertained symbol; and (c) passing parameters indicative of the distribution to the extrinsic coding steps of selecting and combining responsive to each source symbol occurrence.

* * * * *